(12) United States Patent
Pu et al.

(10) Patent No.: US 11,411,099 B2
(45) Date of Patent: Aug. 9, 2022

(54) SEMICONDUCTOR DEVICE

(71) Applicant: GLC SEMICONDUCTOR GROUP (CQ) CO., LTD., Chongqing (CN)

(72) Inventors: Chi-Ching Pu, Hsinchu County (TW); Shun-Min Yeh, Hsinchu (TW)

(73) Assignee: GLC SEMICONDUCTOR GROUP (CQ) CO., LTD., Chongqing (CN)

( * ) Notice: Subject to any disclaimer, the term of this patent is extended or adjusted under 35 U.S.C. 154(b) by 59 days.

(21) Appl. No.: 16/520,320

(22) Filed: Jul. 23, 2019

(65) Prior Publication Data

US 2020/0381554 A1    Dec. 3, 2020

(30) Foreign Application Priority Data

May 28, 2019 (TW) ................................ 108118339
May 28, 2019 (TW) ................................ 108118357

(51) Int. Cl.

| | |
|---|---|
| *H01L 29/15* | (2006.01) |
| *H01L 29/66* | (2006.01) |
| *H01L 29/417* | (2006.01) |
| *H01L 29/08* | (2006.01) |
| *H01L 29/40* | (2006.01) |
| *H01L 21/02* | (2006.01) |
| *H01L 29/20* | (2006.01) |
| *H01L 29/423* | (2006.01) |
| *H01L 29/778* | (2006.01) |
| *H01L 29/78* | (2006.01) |

(52) U.S. Cl.
CPC .. *H01L 29/66712* (2013.01); *H01L 21/02505* (2013.01); *H01L 29/0882* (2013.01); *H01L 29/2003* (2013.01); *H01L 29/401* (2013.01); *H01L 29/41741* (2013.01); *H01L 29/4236* (2013.01); *H01L 29/66522* (2013.01); *H01L 29/7788* (2013.01); *H01L 29/7827* (2013.01)

(58) Field of Classification Search
CPC .......... H01L 21/02458; H01L 21/0254; H01L 29/2003; H01L 29/41741; H01L 29/4236; H01L 29/7827; H01L 29/66712; H01L 29/0882; H01L 29/401; H01L 29/6652
USPC .......................................................... 257/76
See application file for complete search history.

(56) References Cited

U.S. PATENT DOCUMENTS

| | | | | |
|---|---|---|---|---|
| 5,496,755 | A | * | 3/1996 | Bayraktaroglu .... H01L 27/0605 257/E27.012 |
| 5,949,140 | A | * | 9/1999 | Nishi .................... H01L 23/481 257/728 |
| 6,054,748 | A | * | 4/2000 | Tsukuda .............. H01L 29/0615 257/487 |

(Continued)

*Primary Examiner* — Jay C Kim
(74) *Attorney, Agent, or Firm* — Winston Hsu

(57) ABSTRACT

A semiconductor device includes a substrate, a first III-V compound layer, a gate electrode, drain trenches, and at least one drain electrode. The drain trenches are disposed and arranged with high integrity. The substrate has a first side and a second side opposite to the first side. The first III-V compound layer is disposed at the first side of the substrate. The gate electrode is disposed on the first III-V compound layer. Each of the drain trenches extends from the second side of the substrate toward the first side of the substrate and penetrates the substrate. The drain trenches are arranged regularly. The drain electrode is disposed in at least one of the drain trenches.

11 Claims, 12 Drawing Sheets

(56) References Cited

U.S. PATENT DOCUMENTS

| | | | | |
|---|---|---|---|---|
| 7,067,857 B2* | 6/2006 | Mochizuki | H01L 27/0823 | 257/197 |
| 7,132,321 B2* | 11/2006 | Kub | H01L 29/0657 | 438/172 |
| 7,442,584 B2* | 10/2008 | Blanchard | H01L 29/0634 | 257/E21.388 |
| 7,541,640 B2* | 6/2009 | Brar | H01L 29/47 | 257/329 |
| 7,659,576 B2* | 2/2010 | Okada | H01L 29/41741 | 257/332 |
| 7,713,794 B2* | 5/2010 | Iwamuro | H01L 29/0886 | 438/140 |
| 7,781,894 B2* | 8/2010 | Oikawa | H01L 21/76898 | 257/774 |
| 7,834,461 B2* | 11/2010 | Asai | H01L 21/76898 | 257/774 |
| 7,888,713 B2* | 2/2011 | Kawasaki | H01L 29/2003 | 257/289 |
| 8,003,525 B2* | 8/2011 | Okamoto | H01L 21/76898 | 438/648 |
| 8,158,514 B2* | 4/2012 | Kruger | H01L 21/76898 | 438/667 |
| 8,294,208 B2* | 10/2012 | Burke | H01L 29/4236 | 257/330 |
| 8,304,916 B1* | 11/2012 | Sarkozy | H01L 23/481 | 257/774 |
| 8,378,387 B2* | 2/2013 | Ota | H01L 29/41741 | 257/192 |
| 8,390,027 B2* | 3/2013 | Iwamuro | H01L 21/0243 | 257/190 |
| 8,415,737 B2* | 4/2013 | Brar | H01L 29/66848 | 257/328 |
| 8,487,375 B2* | 7/2013 | Okamoto | H01L 29/7787 | 257/335 |
| 8,502,345 B2* | 8/2013 | Nemoto | H01L 29/739 | 257/565 |
| 8,507,949 B2* | 8/2013 | Nishimori | H01L 29/0657 | 257/192 |
| 8,564,028 B2* | 10/2013 | Iwamuro | H01L 29/7827 | 257/260 |
| 8,618,557 B2* | 12/2013 | Yoshikawa | H01L 29/0661 | 257/77 |
| 8,937,337 B2* | 1/2015 | Minoura | H01L 29/66462 | 257/194 |
| 8,987,075 B2* | 3/2015 | Nishimori | H01L 29/66431 | 438/172 |
| 9,196,731 B2* | 11/2015 | Kume | H01L 29/4236 | |
| 9,281,359 B2* | 3/2016 | Zundel | H01L 29/66734 | |
| 9,419,117 B2* | 8/2016 | Aketa | H01L 21/0475 | |
| 10,163,707 B2* | 12/2018 | Chang | H01L 29/7787 | |
| 2002/0117681 A1 | 8/2002 | Weeks | | |
| 2007/0215938 A1* | 9/2007 | Yanagida | H01L 29/0696 | 257/330 |
| 2009/0166677 A1* | 7/2009 | Shibata | H01L 29/7783 | 257/192 |
| 2011/0272708 A1 | 11/2011 | Yoshioka | | |
| 2015/0270356 A1 | 9/2015 | Palacios | | |
| 2015/0364590 A1* | 12/2015 | Ohno | H01L 29/66462 | 257/194 |
| 2017/0125574 A1 | 5/2017 | Chowdhury | | |
| 2018/0061974 A1 | 3/2018 | Saito | | |
| 2019/0296140 A1* | 9/2019 | Yoshimochi | H01L 21/0262 | |

\* cited by examiner

SEMICONDUCTOR DEVICE

BACKGROUND OF THE INVENTION

1. Field of the Invention

The present invention relates to a semiconductor device, and more particularly, to a semiconductor device including a drain trench.

2. Description of the Prior Art

Because of the semiconductor characteristics, III-V semiconductor compounds may be applied in many kinds of integrated circuit devices, such as high power field effect transistors, high frequency transistors, or high electron mobility transistors (HEMTs). In recent years, gallium nitride (GaN) based materials have been applied in the high power and high frequency products because of the properties of wider band-gap and high saturation velocity. Two-dimensional electron gas (2DEG) may be generated by the piezoelectricity property of the GaN-based materials, and the switching velocity may be enhanced because of the higher electron velocity and the higher electron density of the 2DEG. However, with demands for higher performance of the related semiconductor devices, the structural design and/or the process design have to be modified continuously for improving the distribution density of the transistors and/or the electrical performance of the transistor and satisfying the product specifications.

SUMMARY OF THE INVENTION

It is one of the objectives of the present invention to provide a semiconductor device. A drain trench is disposed at a back side of a substrate, and a drain electrode is disposed at the back side of the substrate and disposed in the drain trench for increasing the distribution density of transistors. In addition, the drain trenches may be arranged regularly for improving the process uniformity of the drain trenches. The manufacturing yield and/or the integrated electrical performance may be improved accordingly.

A semiconductor device is provided in an embodiment of the present invention. The semiconductor device includes a substrate, a first III-V compound layer, a gate electrode, drain trenches disposed and arranged with high integrity, and at least one drain electrode. The substrate has a first side and a second side opposite to the first side. The first III-V compound layer is disposed at the first side of the substrate. The gate electrode is disposed on the first III-V compound layer. Each of the drain trenches extends from the second side of the substrate toward the first side of the substrate and penetrates the substrate, and the drain trenches are arranged regularly. The drain electrode is disposed in at least one of the drain trenches.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

It is noted that references in the specification to "one embodiment," "an embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

Figure 1:
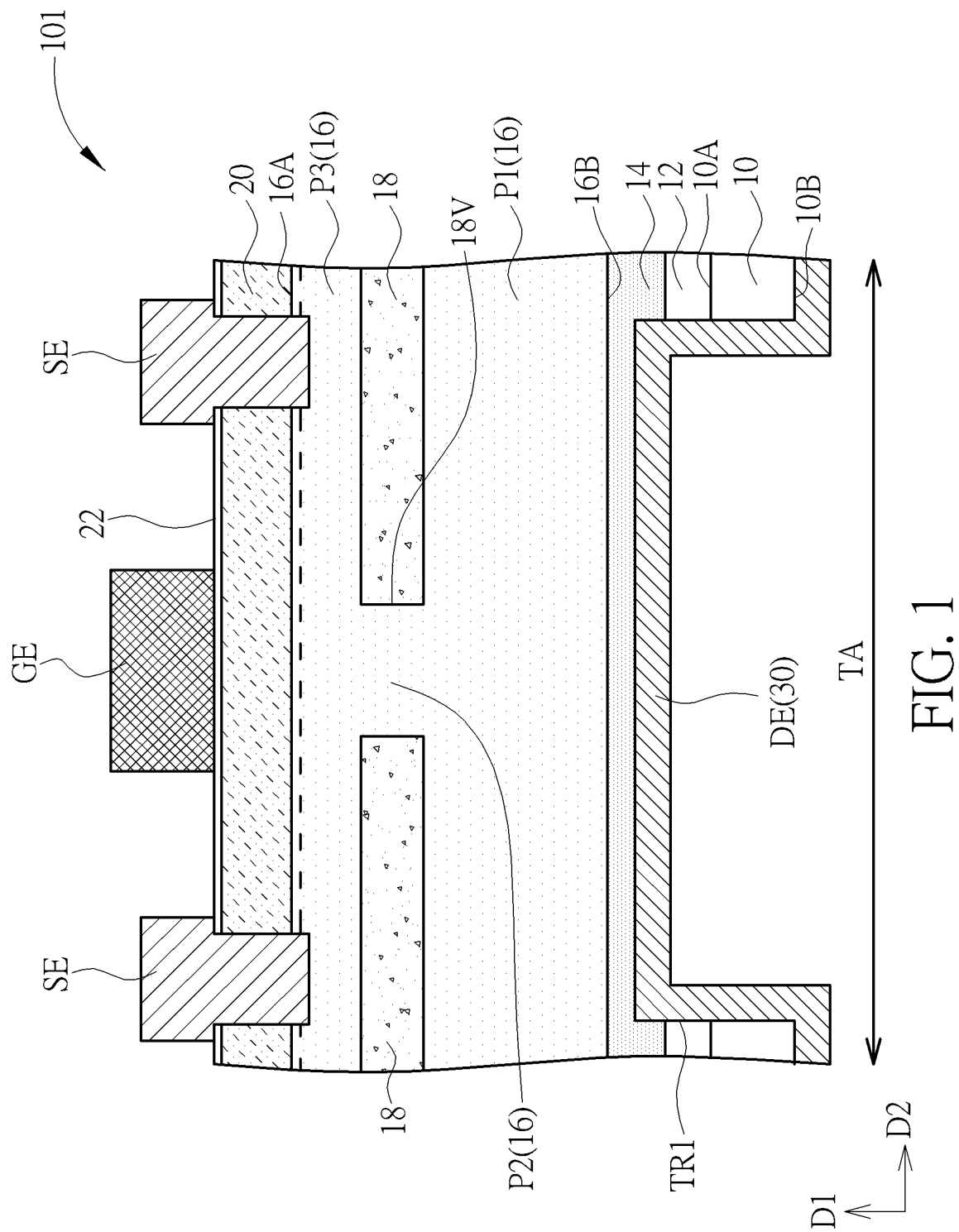
FIG. 1 is a schematic drawing illustrating a semiconductor device according to a first embodiment of the present invention.

Please refer to FIG. 1. FIG. 1 is a schematic drawing illustrating a semiconductor device according to a first embodiment of the present invention. As shown in FIG. 1, a semiconductor device 101 is provided in this embodiment. The semiconductor device 101 includes a substrate 10, a first III-V compound layer 16, a gate electrode GE, at least one drain trench TR1, and at least one drain electrode DE. The substrate 10 has a first side 10A and a second side 10B opposite to the first side 10A. The first side 10A and the second side 10B may be regarded as two opposite sides of the substrate 10 in a thickness direction of the substrate 10 (such as a first direction D1 shown in FIG. 1), but not limited thereto. The first III-V compound layer 16 may be disposed at the first side 10A of the substrate 10. The gate electrode GE may be disposed on the first III-V compound layer 16. The drain trench TR1 may extend from the second side 10B of the substrate 10 toward the first side 10A of the substrate 10 and penetrate the substrate 10. The drain electrode DE may be disposed in the drain trench TR1.

Figure 2:
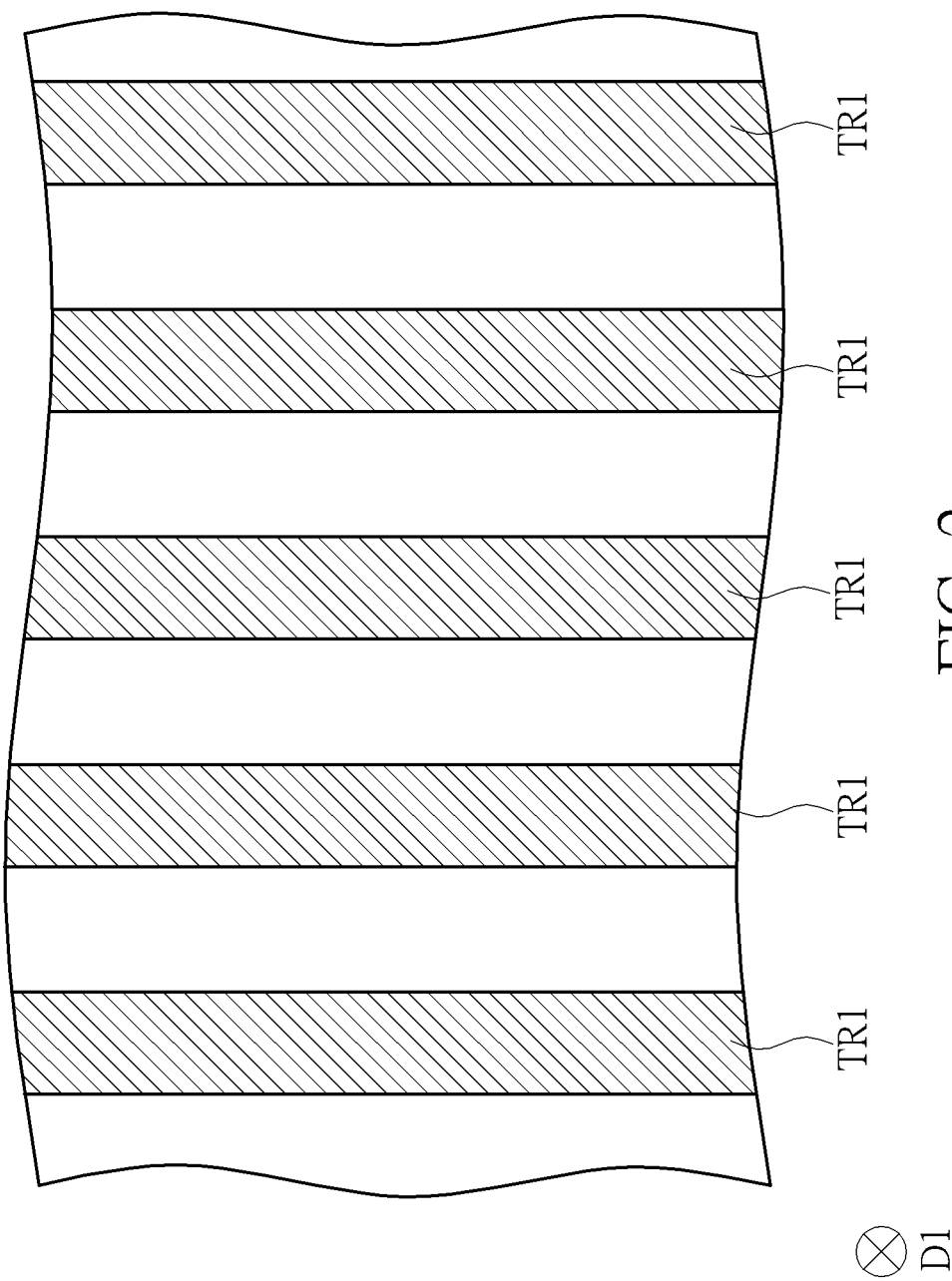
FIG. 2 is a schematic drawing illustrating an arrangement of drain trenches in the semiconductor device according to an embodiment of the present invention.
Figure 3:
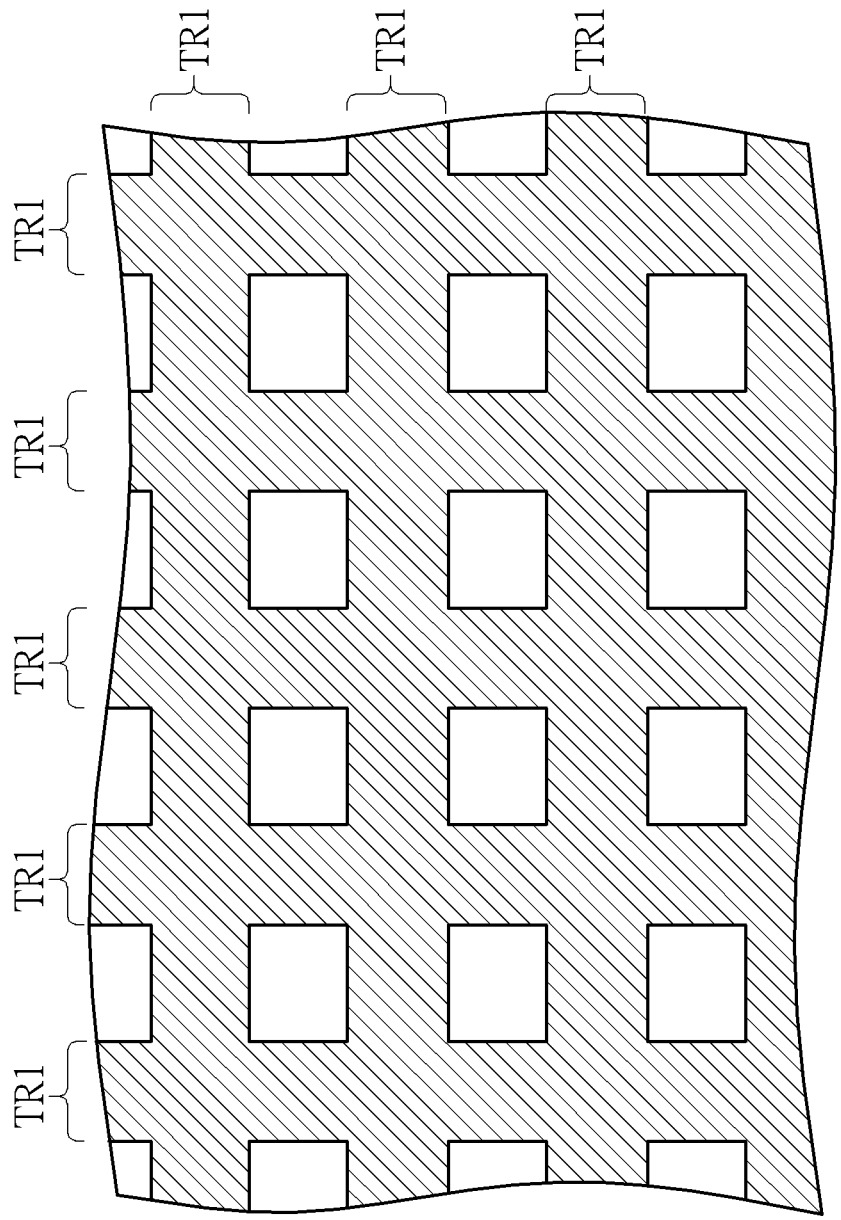
FIG. 3 is a schematic drawing illustrating an arrangement of drain trenches in the semiconductor device according to another embodiment of the present invention.
Figure 4:
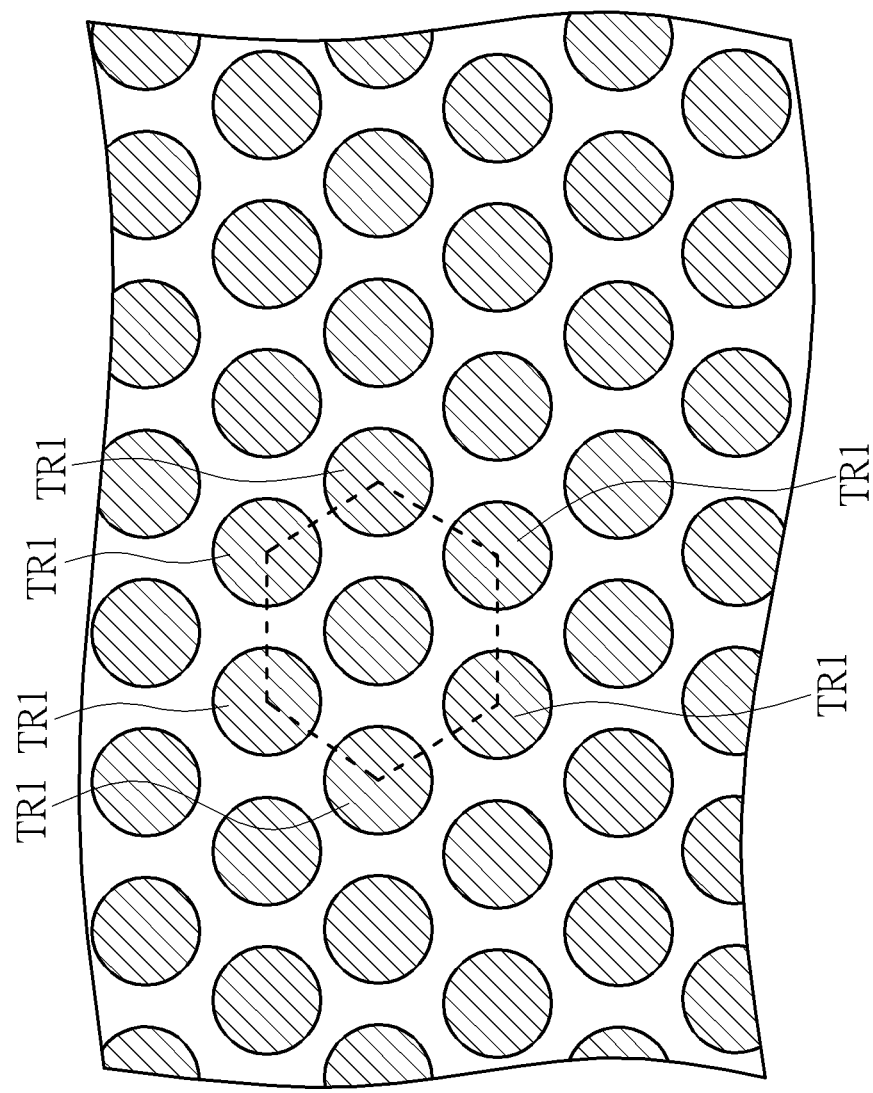
FIG. 4 is a schematic drawing illustrating an arrangement of drain trenches in the semiconductor device according to further another embodiment of the present invention.

Please refer to FIG. 1, FIG. 2, FIG. 3, and FIG. 4. FIG. 2 is a schematic drawing illustrating an arrangement of the drain trenches TR1 in the semiconductor device according to an embodiment of the present invention, FIG. 3 is a schematic drawing illustrating an arrangement of the drain trenches TR1 in the semiconductor device according to another embodiment of the present invention, and FIG. 4 is a schematic drawing illustrating an arrangement of the drain trenches TR1 in the semiconductor device according to further another embodiment of the present invention. As shown in FIG. 1 and FIG. 2, in some embodiments, the semiconductor device 101 may include a plurality of the drain trenches TR1 disposed and arranged with high integrity, and the drain trenches TR1 may be arranged regularly. The drain electrode DE may be disposed in at least one of the drain trenches TR1. For example, in some embodiments, each of the drain trenches TR1 may include a slot trench, and the drain trenches TR1 may extend in the same direction and are parallel with one another (such as the arrangement shown in FIG. 2). In addition, there may be a plurality of the drain electrodes DE in the semiconductor device, and the drain electrodes DE may be disposed in the corresponding drain trenches TR1 respectively, or one of the drain electrodes DE may be disposed in two or more of the drain trenches TR1. In other words, the drain electrodes DE disposed in different drain trenches TR1 may be connected with one another or be separated from one another. Additionally, in some embodiments, the semiconductor device 101 may include a plurality of the gate electrodes GE, and each of the gate electrodes GE may be disposed corresponding to one of the drain electrodes DE, but not limited thereto.

It is worth noting that the manufacturing uniformity of forming the drain trenches TR1 (such as the uniformity of depths of the drain trenches TR1) may be improved by arranging the drain trenches TR1 regularly, and the uniformity of electrical performance of semiconductor devices (such as transistors) including the drain electrodes DE formed in the drain trenches TR1 may be improved accordingly. Additionally, in some embodiments, as shown in FIG. 1 and FIG. 3, each of the drain trenches TR1 may include a slot trench, and the drain trenches TR1 may interlace with one another and be connected with one another. In some embodiments, as shown in FIG. 1 and FIG. 4, the drain trenches TR1 may be separated from one another, and at least some of the drain trenches TR1 may be arranged by a hexagon configuration. For example, as shown in FIG. 4, centers of six of the drain trenches TR1 may be connected with one another to form a hexagon (such as a regular hexagon), but not limited thereto. It is worth noting that the arrangement of the drain trenches TR1 in the present invention is not limited to the conditions shown in FIGS. 2-4 and the drain trenches TR1 may also be arranged by other suitable design.

Specifically, as shown in FIG. 1, in some embodiments, the semiconductor device 101 may further include a buffer layer 12, a second III-V compound layer 14, a nitride layer 20, a gate dielectric layer 22, and a source electrode SE. The buffer layer 12 may be disposed between the substrate 10 and the first III-V compound layer 16, and the second III-V compound layer 14 may be disposed between the buffer layer 12 and the first III-V compound layer 16. The nitride layer 20 may be disposed at the first side 10A of the substrate 10, and at least a part of the nitride layer 20 may be located between the gate electrode GE and the first III-V compound layer 16. The source electrode SE may be disposed at the first side 10A of the substrate 10, and at least a part of the first III-V compound layer 16 may be located between the source electrode SE and the second III-V compound layer 14. In some embodiments, the buffer layer 12, the second III-V compound layer 14, the first III-V compound layer 16, and the nitride layer 20 may be stacked sequentially on the substrate 10 in the first direction D1, and the drain trench TR1 may further penetrate the buffer layer 12 and be partially disposed in the second III-V compound layer 14. In addition, the source electrode SE may penetrate the nitride layer 20 and be partially disposed in the first III-V compound layer 16, and the source electrode SE may be located at two sides of the gate electrode GE in a horizontal direction (such as a second direction D2 shown in FIG. 1) and/or surround the gate electrode GE in the horizontal direction, but not limited thereto. In some embodiments, the gate electrode GE and the source electrode SE may be disposed within a transistor unit area TA, and at least one of the drain trenches TR1 may be disposed within the transistor unit area TA. The transistor unit area TA may be an area where a single transistor is located, but not limited thereto. In other words, a single transistor may be disposed corresponding to one or more drain trenches TR1, and the influence of the drain trenches TR1 on the electrical performance of the transistor when a process issue occurs at one of the drain trenches TR1 may be reduced by the drain trenches TR1 arranged with high integrity In some embodiments, the substrate 10 may include a silicon substrate, a silicon carbide (SiC) substrate, a sapphire substrate, or substrate formed by other appropriate materials, and the buffer layer 12 may include a buffer material beneficial for forming a III-V compound layer on the substrate 10 by an epitaxial growth approach. Therefore, the buffer layer 12 may include gallium nitride (GaN), aluminum gallium nitride (AlGaN), or other suitable buffer materials. In addition, the first III-V compound layer 16 and the second III-V compound layer 14 may include gallium nitride, indium gallium nitride (InGaN), and/or other suitable III-V compound semiconductor materials. In some embodiments, the first III-V compound layer 16 and the second III-V compound layer 14 may be a single layer or multiple layers of the III-V compound materials described above. In some embodiments, the first III-V compound layer 16 and the second III-V compound layer 14 may be the same III-V compound material with different doping concentrations. For example, the first III-V compound layer 16 may include an n-type lightly doped gallium nitride layer, and the second III-V compound layer 14 may include an n-type heavily doped gallium nitride layer, but not limited thereto. The n-type dopant may include silicon, germanium, or other suitable dopants. In addition, the nitride layer 20 may be used as a barrier layer or a capping layer in a semiconductor device. The nitride layer 20 may be formed by materials such as aluminum gallium nitride, aluminum indium nitride (AlInN), and/or aluminum nitride (AlN) when the nitride layer 20 is used as a barrier layer, and the nitride layer 20 may be formed by materials such as aluminum gallium nitride, aluminum nitride, gallium nitride, and/or silicon nitride when the nitride layer 20 is used as a capping layer, but not limited thereto. In addition, the nitride layer 20 may include a single layer or multiple layers of the III-nitride materials.

In some embodiments, the gate dielectric layer 22 may include a single layer or multiple layers of dielectric materials, such as silicon nitride (such as $Si_3N_4$), silicon oxide (such as $SiO_2$), aluminum oxide (such as $Al_2O_3$), hafnium oxide (such as $HfO_2$), lanthanum oxide (such as $La_2O_3$), lutetium oxide (such as $Lu_2O_3$), lanthanum lutetium oxide (such as $LaLuO_3$), or other suitable dielectric materials, but not limited thereto. Additionally, the gate electrode GE, the source electrode SE, and the drain electrode DE may respectively include conductive metal materials or other suitable conductive materials. The conductive metal materials mentioned above may include gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above-mentioned materials, a stack layer of any of the above-mentioned materials, or an alloy of the above-mentioned materials, but not limited thereto. For example, the drain electrode DE may be formed of a first conductive layer 30 partially formed in the drain trench TR1 and partially formed outside the drain trench TR1, and the first conductive layer 30 may include a single layer or multiple layers of the conductive materials mentioned above. Because the source electrode SE and the gate electrode GE of the semiconductor device 101 may be disposed at a front side of the first III-V compound layer 16 (such as a third side 16A shown in FIG. 1) and the drain electrode DE of the semiconductor device 101 may be disposed at a back side of the first III-V compound layer 16 (such as a fourth side 16B shown in FIG. 1), the semiconductor device 101 may be regarded as a vertical type transistor structure, such as a vertical type gallium nitride high electron mobility transistor (HEMT), but not limited thereto. By the design of the vertical type transistor structure, the area occupied by each transistor may be reduced, and the purpose of increasing the distribution density of the transistors may be achieved accordingly. In addition, because of the design of the drain trench TR1, a substrate with relatively lower cost (such as a silicon substrate) may be applied in an epitaxial process for forming the III-V compound layer instead of using a III-V compound substrate with higher cost (such as a gallium nitride substrate) directly, and that will be beneficial for reducing the manufacturing cost and enhancing the product competitiveness.

In some embodiments, the semiconductor device 101 may further include a third III-V compound layer 18 disposed at the first side 10A of the substrate 10, and at least a part of the first III-V compound layer 16 may be located between the third III-V compound layer 18 and the second III-V compound layer 14. For example, the third III-V compound layer 18 may be disposed in the first III-V compound layer 16, and the third III-V compound layer 18 may have an opening 18V disposed corresponding to the gate electrode GE in the first direction D1. In this configuration, a first portion P1 of the first III-V compound layer 16 may be located between the third III-V compound layer 18 and the second III-V compound layer 14, a second portion P2 of the first III-V compound layer 16 may be located in the opening 18V, and a third portion P3 of the first III-V compound layer 16 may be located between the nitride layer 20 and the third III-V compound layer 18. In some embodiments, the third III-V compound layer 18 and the second III-V compound layer 14 may be the same III-V compound material with different doping types. For example, the second III-V compound layer 14 may include an n-type heavily doped gallium nitride layer, the third III-V compound layer 18 may include a p-type doped gallium nitride layer, the first portion P1 of the first III-V compound layer 16 may include an n-type lightly doped gallium nitride layer, the second portion P2 of the first III-V compound layer 16 may include an n-type doped gallium nitride layer, and the third portion P3 of the first III-V compound layer 16 may include an unintentionally doped (UID) gallium nitride layer, but not limited thereto. The p-type dopant may include magnesium or other suitable dopants. In some embodiments, the third III-V compound layer 18 may include a III-V compound material different from the second III-V compound layer 14. In addition, the third III-V compound layer 18 may be regarded as a current blocking layer (CBL), the first portion P1 of the first III-V compound layer 16 may be regarded as a drift region, two-dimensional electron gas (2DEG) may be localized in the third portion P3 of the first III-V compound layer 16 and at a side adjacent to the nitride layer 20 (such as a location of a dotted line shown in FIG. 1), and the semiconductor device 101 may be regarded as a current-aperture vertical electron transistor (CAVET), but not limited thereto.

It is worth noting that the structure of the semiconductor device in the present invention is not limited to the condition shown in FIG. 1, and other types of semiconductor structures including the first III-V compound layer 16 may be located at the front side of the substrate 10 (such as the first side 10A) and be combined with the drain electrode DE and the drain trench TR1 penetrating the substrate 10 from the back side of the substrate 10 (such as the second side 10B).

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 5:
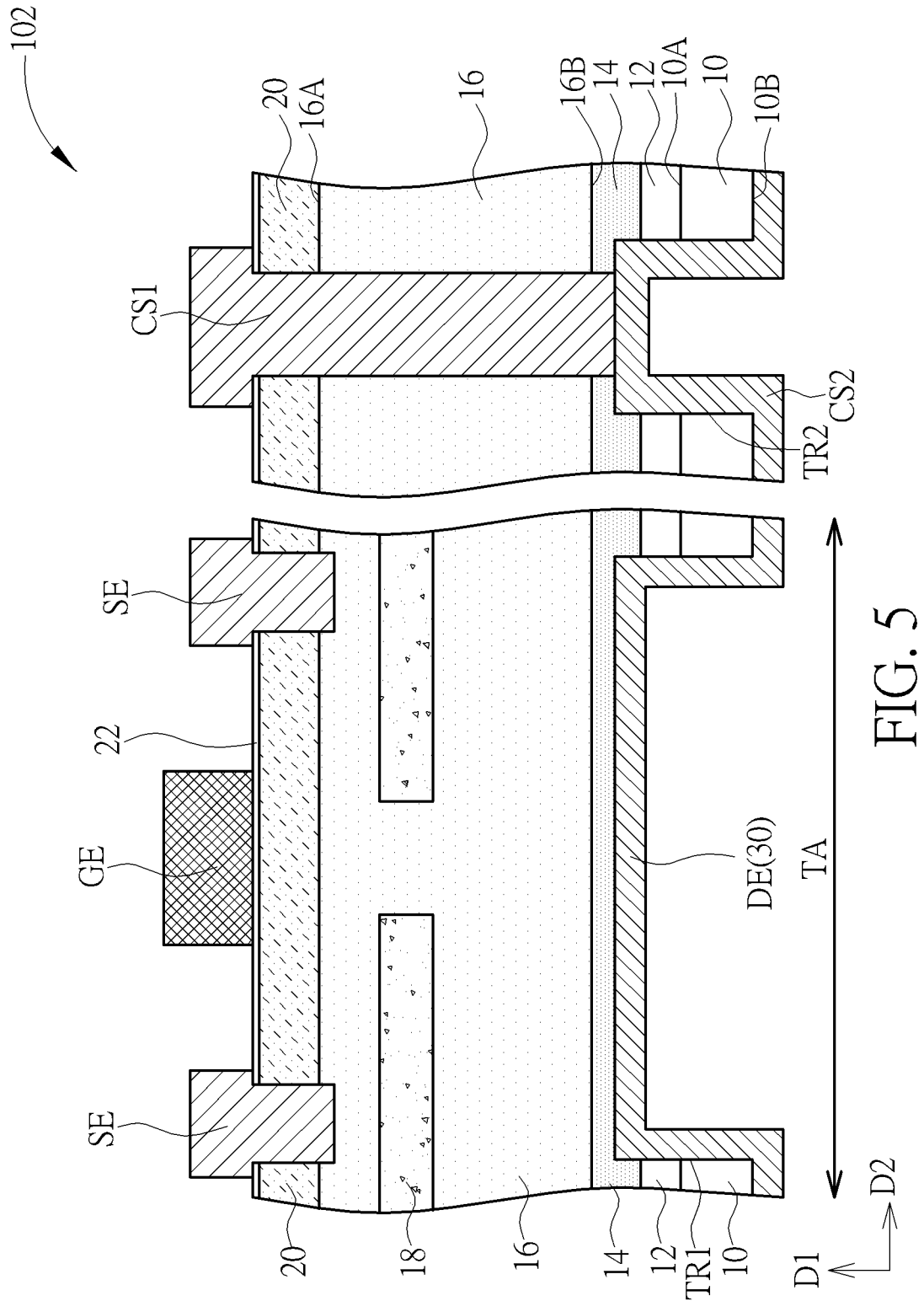
FIG. 5 is a schematic drawing illustrating a semiconductor device according to a second embodiment of the present invention.

Please refer to FIG. 5. FIG. 5 is a schematic drawing illustrating a semiconductor device 102 according to a second embodiment of the present invention. As shown in FIG. 5, the semiconductor device 102 may further include a contact structure CS1, a contact trench TR2, and a back contact structure CS2. The contact trench TR2 may extend from the second side 10B of the substrate 10 toward the first side 10A of the substrate 10 and penetrate the substrate 10, and the contact trench TR2 may be separated from the drain trench TR1. The back contact structure CS2 may be disposed in the contact trench TR2, and the back contact structure CS2 may be electrically separated from the drain electrode DE. In addition, the contact structure CS1 may be disposed at the first side 10A of the substrate 10, and the contact structure CS1 may be electrically connected with the back contact structure CS2. In some embodiments, the contact structure CS1 may penetrate the nitride layer 20 and the first III-V compound layer 16 in the first direction D1 and be partially disposed in the second III-V compound layer 14 for contacting and being electrically connected with the back contact structure CS2 penetrating the substrate 10 and the buffer layer 12 and partially disposed in the second III-V compound layer 14, but not limited thereto. The contact structure CS1 and the back contact structure CS2 may respectively include conductive metal materials or other suitable conductive materials. The conductive metal materials mentioned above may include gold, tungsten, cobalt, nickel, titanium, molybdenum, copper, aluminum, tantalum, palladium, platinum, a compound of the above-mentioned materials, a stack layer of the above-mentioned materials, or an alloy of the above-mentioned materials, but not limited thereto. In some embodiments, the contact structure CS1 may be electrically connected with the source electrode SE or the gate electrode GE via other conductive structures (not shown) located at the first side 10A of the substrate 10, the contact structure CS1 and the source electrode SE may be formed concurrently by the same process, or the contact structure CS1 and the gate electrode GE may be formed concurrently by the same process, and the source electrode SE and/or the gate electrode GE may be electrically connected to the back contact structure CS2 via the contact structure CS1 accordingly, but not limited thereto. In some embodiments, the semiconductor device may include a plurality of the contact structures CS1 and corresponding back contact structures CS2, a wire bonding process may be performed at the second side 10B of the substrate 10 for forming electrical connection with the drain electrode DE, the source electrode SE, and the gate electrode GE from the back side, and the purposes of simplifying the related wiring layout design and/or simplifying the related manufacturing processes may be achieved accordingly.

Figure 6:
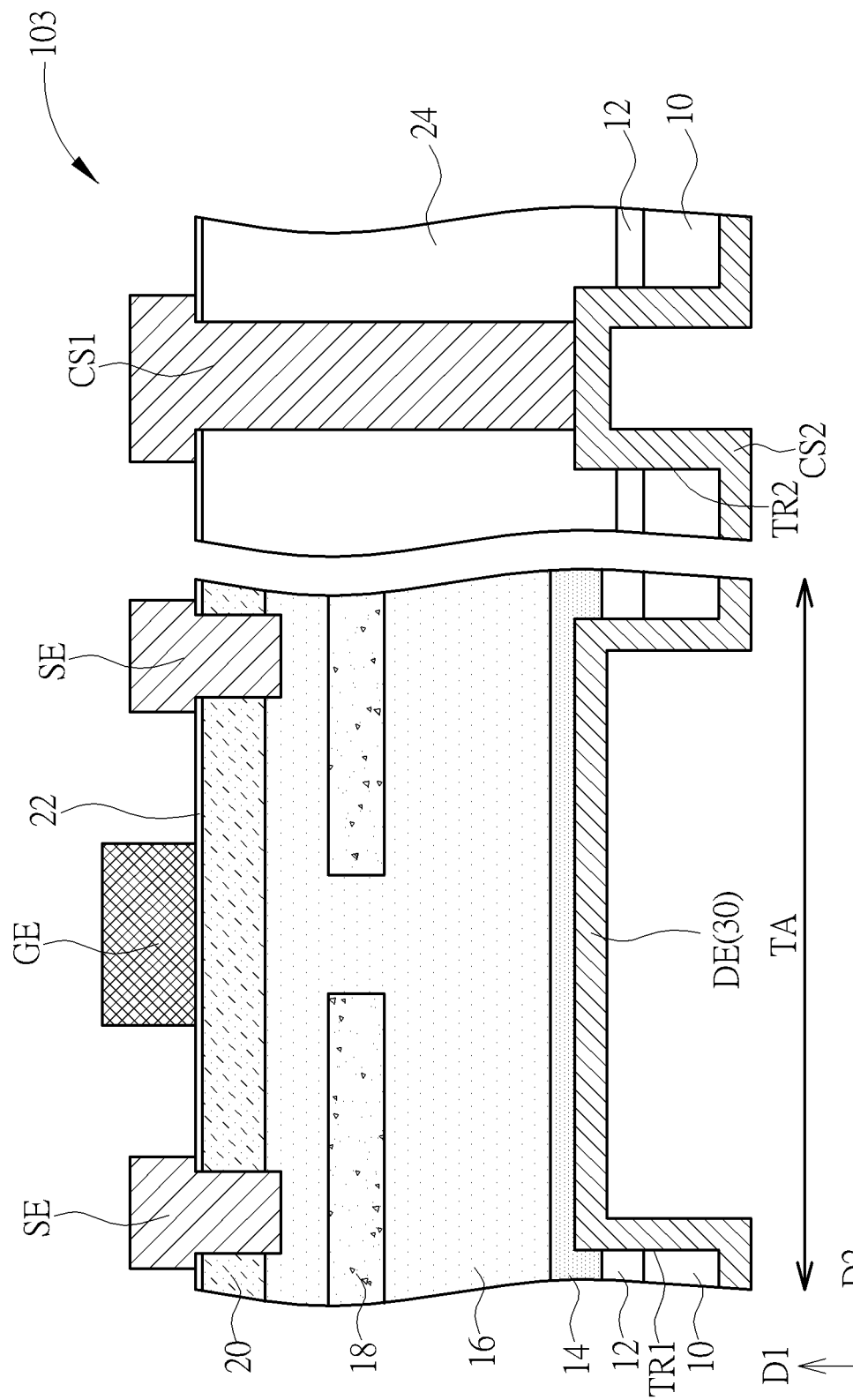
FIG. 6 is a schematic drawing illustrating a semiconductor device according to a third embodiment of the present invention.

Please refer to FIG. 6. FIG. 6 is a schematic drawing illustrating a semiconductor device 103 according to a third embodiment of the present invention. As shown in FIG. 6, the difference between the semiconductor device 103 and the semiconductor device of the second embodiment described above is that, in the semiconductor device 103, the stacked layers located between the drain electrode DE and the gate electrode GE and located between the drain electrode DE and the source electrode SE may form a mesa structure, and the semiconductor device 103 may further include an isolation structure 24 located between the mesa structures for isolating the adjacent mesa structures from one another. The isolation structure 24 may include a single layer or multiple layers of insulation materials, such as silicon oxide, silicon nitride, silicon oxynitride, or other suitable insulation materials. In some embodiments, the contact trench TR2 may penetrate the substrate 10 and the buffer layer 12 for being partially disposed in the isolation structure 24, and the contact structure CS1 may be partially disposed in the isolation structure 24 for contacting and electrically connected with the back contact structure CS2, but not limited thereto.

Figure 7:
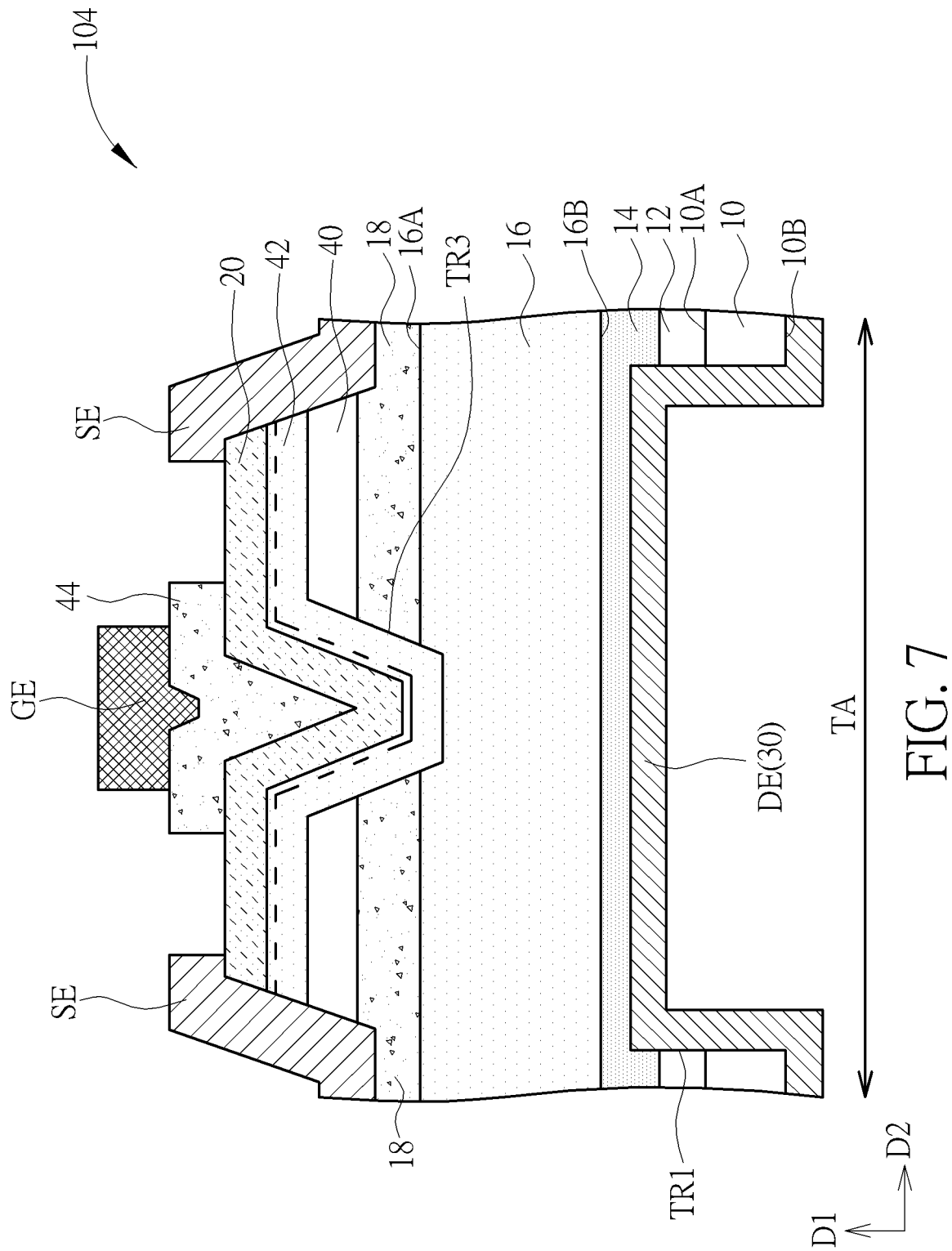
FIG. 7 is a schematic drawing illustrating a semiconductor device according to a fourth embodiment of the present invention.

Please refer to FIG. 7. FIG. 7 is a schematic drawing illustrating a semiconductor device 104 according to a fourth embodiment of the present invention. As shown in FIG. 7, the difference between the semiconductor device 104 and the semiconductor device of the first embodiment described above is that the semiconductor device 104 may further include a trench TR3, a fourth III-V compound layer 42, and a fifth III-V compound layer 44. The trench TR3 may penetrate the third III-V compound layer 18 and be partially located in the first III-V compound layer 16, and the trench TR3 may be disposed corresponding to the gate electrode GE in the first direction D1. At least a part of the fourth III-V compound layer 42 may be disposed in the trench TR3. The nitride layer 20 may be disposed on the fourth III-V compound layer 42 and at least a part of the nitride layer 20 may be disposed in the trench TR3. The fifth III-V compound layer 44 may be disposed on the nitride layer 20, and the gate electrode GE may be disposed on the fifth III-V compound layer 44. In some embodiments, the fourth III-V compound layer 42 and the second III-V compound layer 14 may be the same III-V compound material with different doping concentrations, and the fifth III-V compound layer 44 and the second III-V compound layer 14 may be the same III-V compound material with different doping types. For example, the second III-V compound layer 14 may include an n-type heavily doped gallium nitride layer, the fourth III-V compound layer 42 may include a gallium nitride layer, such as an UID gallium nitride layer, and the fifth III-V compound layer 44 may include a p-type doped gallium nitride layer, but not limited thereto. In some embodiments, the fourth III-V compound layer 42 and/or the fifth III-V compound layer 44 may include a III-V compound material different from the second III-V compound layer 14 according to some considerations.

Additionally, in some embodiments, the semiconductor device 104 may further include a seventh III-V compound layer 40 disposed between the fourth III-V compound layer 42 and the third III-V compound layer 18, and the trench TR3 may further penetrate the seventh III-V compound layer 40. The seventh III-V compound layer 40 may include a semi-insulating III-V compound material, such as carbon doped gallium nitride, ferrum doped gallium nitride, manganese doped gallium nitride, or other suitable III-V compound materials. Additionally, the source electrode SE may be disposed on the third III-V compound layer 18, a lateral surface of the seventh III-V compound layer 40, a lateral surface of the fourth III-V compound layer 42, and a lateral surface and a top surface of the nitride layer 20, but not limited thereto. In this embodiment, the third III-V compound layer 18 may be regarded as a current blocking layer, the first III-V compound layer 16 may be regarded as a drift region, two-dimensional electron gas (2DEG) may be localized in the fourth III-V compound layer 42 and at a side adjacent to the nitride layer 20 (such as a location of a dotted line shown in FIG. 7), and the semiconductor device 104 may be regarded as a trench current-aperture vertical electron transistor (Trench CAVET), but not limited thereto.

Figure 8:
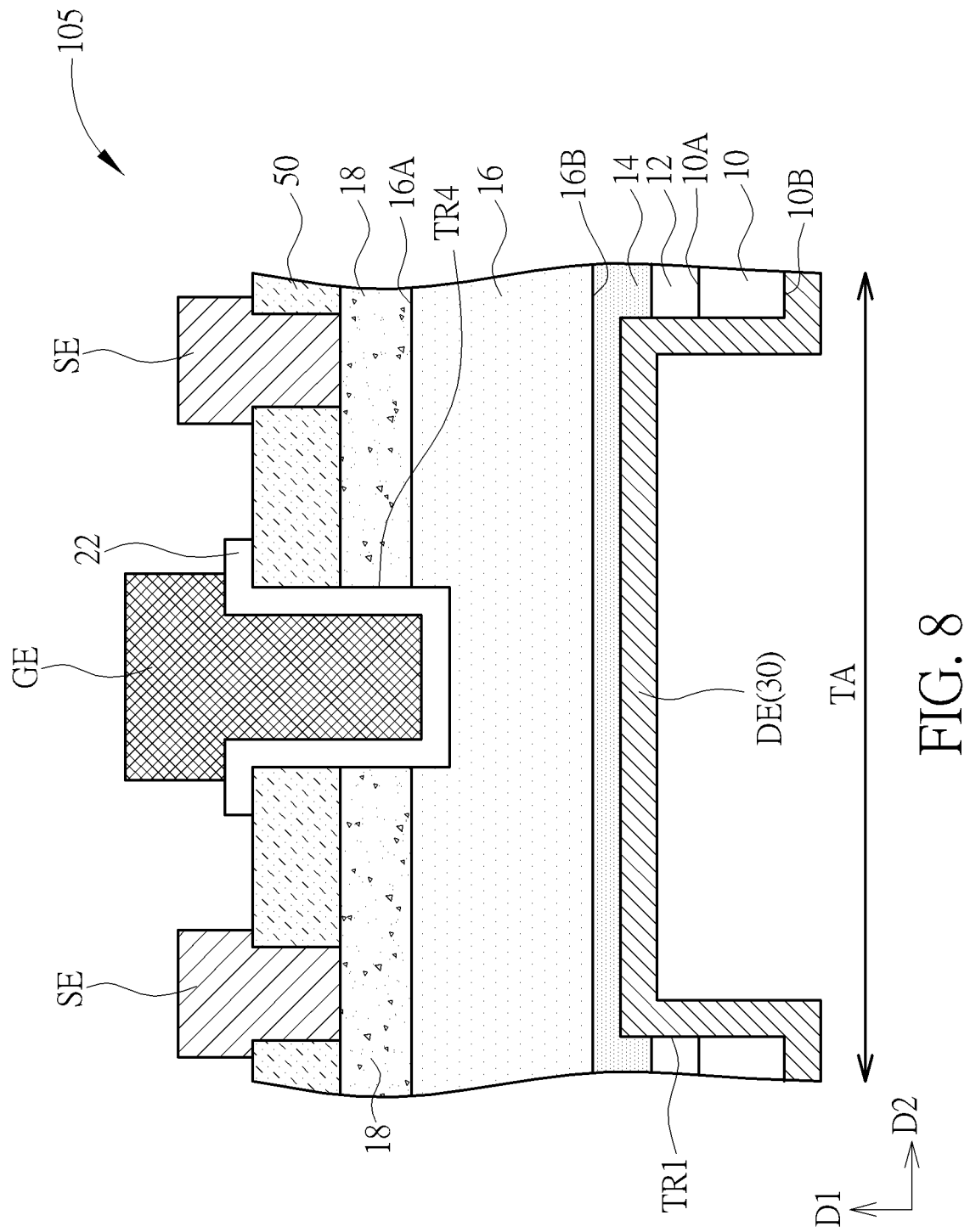
FIG. 8 is a schematic drawing illustrating a semiconductor device according to a fifth embodiment of the present invention.

Please refer to FIG. 8. FIG. 8 is a schematic drawing illustrating a semiconductor device 105 according to a fifth embodiment of the present invention. As shown in FIG. 8, the difference between the semiconductor device 105 and the semiconductor device of the first embodiment described above is that the semiconductor device 105 may further include a gate trench TR4 and a sixth III-V compound layer 50. The sixth III-V compound layer 50 may be disposed on the third III-V compound layer 18. The gate trench TR4 may penetrate the sixth III-V compound layer 50 and the third III-V compound layer 18 in the first direction D1 for being partially located in the first III-V compound layer 16, and at least a part of the gate electrode GE may be disposed in the gate trench TR4. In some embodiments, the material of the sixth III-V compound layer 50 may be similar to the material of the second III-V compound layer 14. For example, the sixth III-V compound layer 50 may include an n-type heavily doped gallium nitride layer, but not limited thereto. In some embodiments, the sixth III-V compound layer 50 may include a III-V compound material (such as other n-type heavily doped III-V compound materials) different from the second III-V compound layer 14 according to some considerations. In addition, the source electrode SE may penetrate the sixth III-V compound layer 50 in the first direction D1 and contact the third III-V compound layer 18, but not limited thereto.

Figure 9:
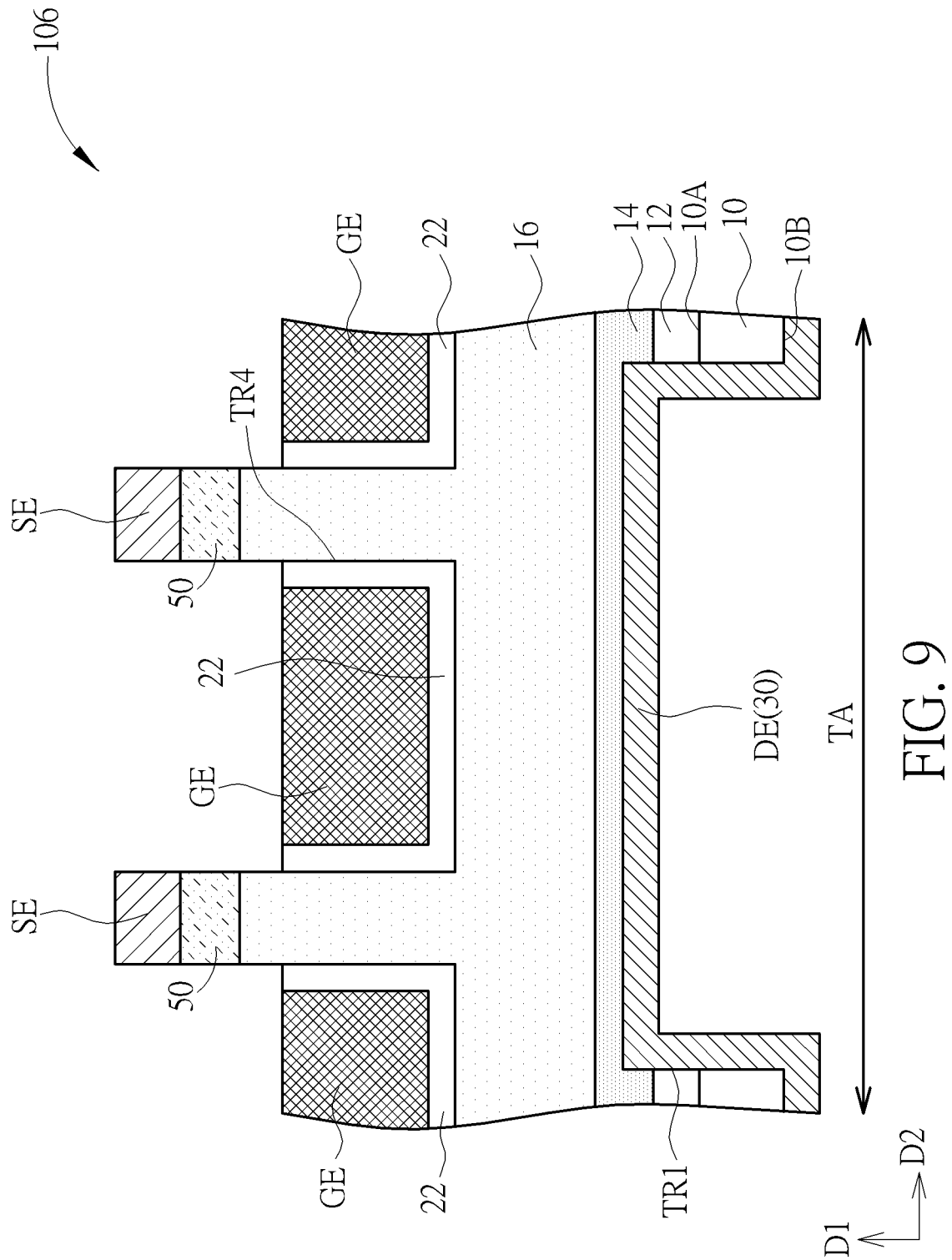
FIG. 9 is a schematic drawing illustrating a semiconductor device according to a sixth embodiment of the present invention.

Please refer to FIG. 9. FIG. 9 is a schematic drawing illustrating a semiconductor device 106 according to a sixth embodiment of the present invention. As shown in FIG. 9, the difference between the semiconductor device 106 and the semiconductor device of the fifth embodiment described above is that the gate trench TR4 in the semiconductor device 106 may be located in the first III-V compound layer 16, the top surface of the gate electrode GE may be lower than the topmost surface of the first III-V compound layer 16 in the first direction D1, and a portion of the first III-V compound layer 16 extending upwards in the first direction D1 may be regarded as a fin structure, but not limited thereto. In addition, the sixth III-V compound layer 50 in this embodiment may be disposed on the fin structure of the first III-V compound layer 16, the source electrode SE may be disposed on the sixth III-V compound layer 50, and the semiconductor device 106 may be regarded as a fin type transistor structure, but not limited thereto.

Figure 10:
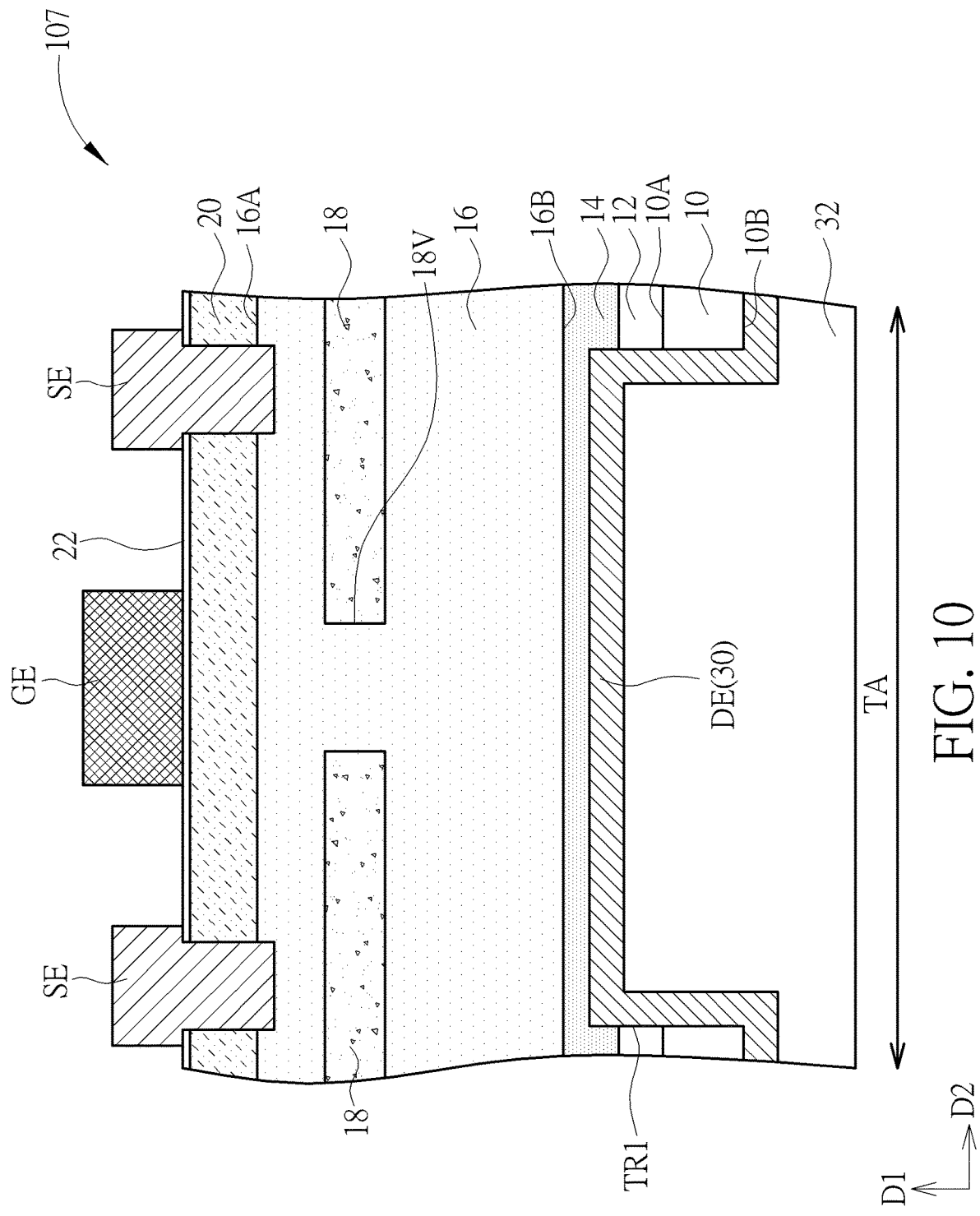
FIG. 10 is a schematic drawing illustrating a semiconductor device according to a seventh embodiment of the present invention.

Please refer to FIG. 10. FIG. 10 is a schematic drawing illustrating a semiconductor device 107 according to a seventh embodiment of the present invention. As shown in FIG. 10, the difference between the semiconductor device 107 and the semiconductor device of the first embodiment described above is that the semiconductor device 107 may further include an insulation layer 32, and at least a part of the insulation layer 32 may be disposed in the drain trench TR1. The insulation layer 32 may cover the drain electrode DE for protecting the drain electrode DE. The insulation layer 32 may include an inorganic insulation material (such as silicon oxide, silicon nitride, or silicon oxynitride), an organic insulation material (such as acrylic resin), or other suitable insulation materials. Additionally, in some embodiments, the drain trench TR1 may be filled with the insulation layer 32 and the drain electrode DE, but not limited thereto. It is worth noting that, when the semiconductor device 107 include a plurality of the drain trenches TR1 (such as the conditions shown in FIGS. 2-4), at least a part of the insulation layer 32 may be disposed in two or more of the drain trenches TR1, and each of the drain trenches TR1 may be filled with the insulation layer 32 and the drain electrode DE, but not limited thereto. In addition, the insulation layer 32 in this embodiment may be applied in other embodiments of the present invention. For example, when the insulation layer 32 in this embodiment is applied to the second embodiment shown by FIG. 5 described above, the insulation layer 32 may be partially disposed in the contact trench TR2 and cover the back contact structure CS2 for forming a protection effect, but not limited thereto.

Figure 11:
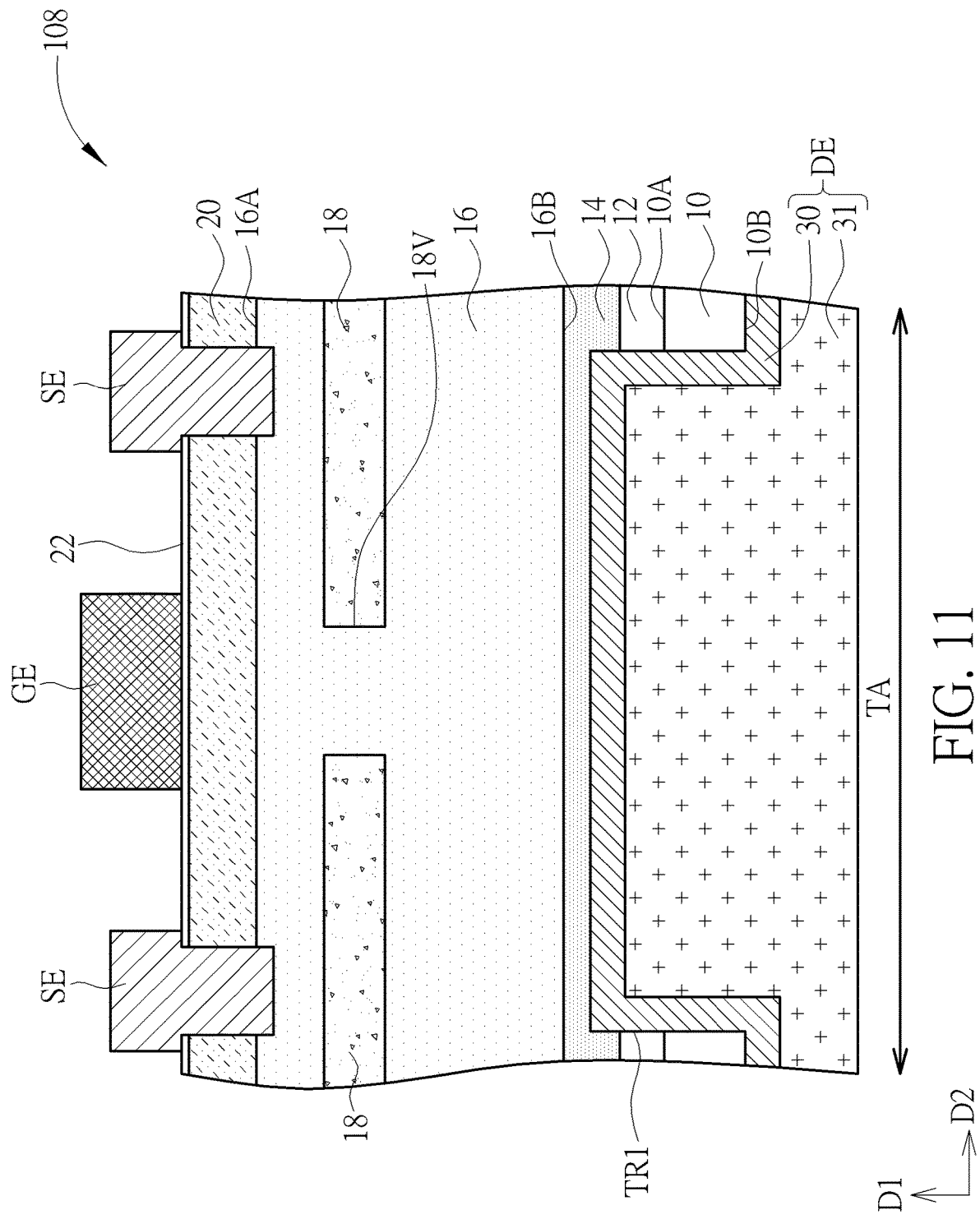
FIG. 11 is a schematic drawing illustrating a semiconductor device according to an eighth embodiment of the present invention.

Please refer to FIG. 11. FIG. 11 is a schematic drawing illustrating a semiconductor device 108 according to an eighth embodiment of the present invention. As shown in FIG. 11, the difference between the semiconductor device 108 and the semiconductor device of the first embodiment described above is that the drain electrode in the semiconductor device 108 may include the first conductive layer 30 and a second conductive layer 31. The first conductive layer 30 may be formed conformally in the drain trench TR1 and on the substrate 10. The second conductive layer 31 may cover the first conductive layer 30, and the material of the second conductive layer 31 may be different from the material of the first conductive layer 30. For example, the first conductive layer 30 may include titanium nitride, tantalum nitride, or other suitable conductive materials with better barrier performance, and the second conductive layer 31 may include conductive materials having relatively lower resistivity, such as copper, aluminum, and tungsten, but not limited thereto. In some embodiments, the drain trench TR1 may be filled with the drain electrode DE, and each of the drain trenches TR1 may be filled with the drain electrode DE when the semiconductor device 108 includes a plurality of the drain trenches TR1 (such as the conditions shown in FIGS. 2-4), but not limited thereto. In some embodiments, an insulation layer may be formed on the second conductive layer 31 for protecting the drain electrode DE by the insulation layer covering the drain electrode DE. In addition, the first conductive layer 30 and the second conductive layer 31 in this embodiment may be applied to other embodiments of the present invention according to some considerations.

Figure 12:
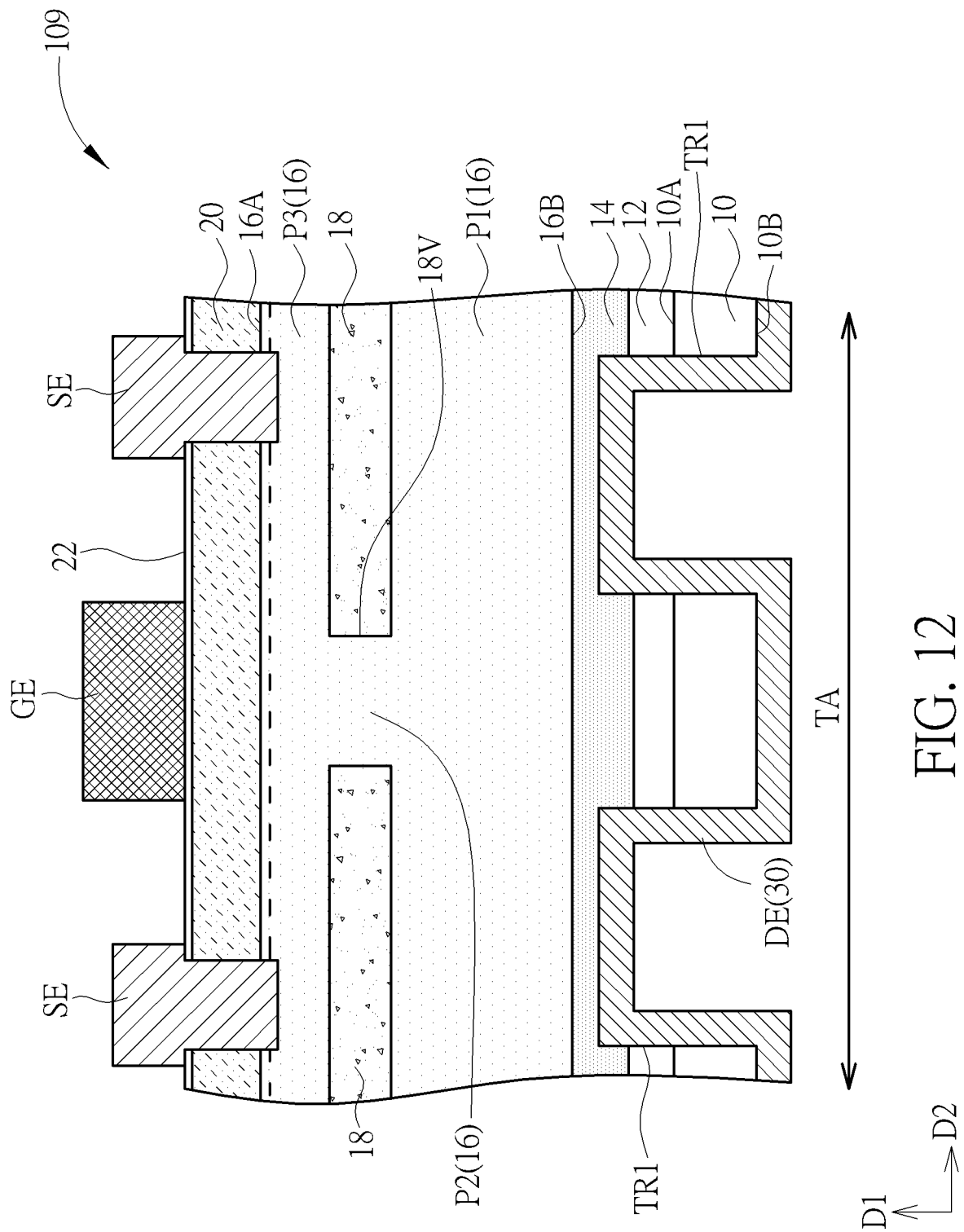
FIG. 12 is a schematic drawing illustrating a semiconductor device according to a ninth embodiment of the present invention.

Please refer to FIG. 12. FIG. 12 is a schematic drawing illustrating a semiconductor device 109 according to a ninth embodiment of the present invention. As shown in FIG. 12, the difference between the semiconductor device 109 and the semiconductor device of the first embodiment described above is that, in the semiconductor device 109, two or more of the drain trenches TR1 may be disposed within one transistor unit area TA, and the drain electrode DE may be disposed in the drain trenches TR1 within the transistor unit area TA. It is worth noting that, according to some considerations, the approach of disposing two or more of the drain trenches TR1 within one transistor unit area TA in this embodiment may also be applied to other embodiments of the present invention.

To summarize the above descriptions, according to the semiconductor device in the present invention, the drain trench and the drain electrode located in the drain trench may be disposed from the back side of the substrate for forming the vertical type transistor structure and increasing the distribution density of the transistors. The manufacturing uniformity of forming the drain trenches may be improved by arranging the drain trenches regularly, and the purpose of improving the manufacturing yield and/or the purpose of enhancing the integrated electrical performance may be achieved accordingly. In addition, because of the design of the drain trench, a substrate with relatively lower cost may be applied in the epitaxial process for forming the III-V compound layer instead of using a III-V compound substrate with high cost directly, and that will be beneficial for reducing the manufacturing cost and enhancing the product competitiveness.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate having a first side and a second side opposite to the first side;
a first III-V compound layer disposed at the first side of the substrate;
a gate electrode disposed on the first III-V compound layer;
drain trenches, wherein each of the drain trenches extends from the second side of the substrate toward the first side of the substrate and penetrates the substrate;
a drain electrode disposed in at least one of the drain trenches;
a buffer layer disposed between the substrate and the first III-V compound layer;
a second III-V compound layer disposed between the buffer layer and the first III-V compound layer, wherein each of the drain trenches further penetrates the buffer layer and is partially disposed in the second III-V compound layer;
a source electrode disposed at the first side of the substrate, wherein a first portion of the first III-V compound layer is located between the source electrode and the second III-V compound layer;
a third III-V compound layer disposed at the first side of the substrate, wherein the first portion of the first III-V compound layer is located between the third III-V compound layer and the second III-V compound layer, and a second portion of the first III-V compound layer is located between the source electrode and the third III-V compound layer, wherein the third III-V compound layer has an opening disposed corresponding to the gate electrode, a third portion of the first III-V compound layer is located in the opening, and the third portion of the first III-V compound layer is directly connected with the first portion of the first III-V compound layer and the second portion of the first III-V compound layer;
a contact trench extending from the second side of the substrate toward the first side of the substrate and penetrating the substrate; and
a back contact structure disposed in the contact trench, wherein the back contact structure is electrically separated from the drain electrode.

2. The semiconductor device according to claim 1, wherein each of the drain trenches comprises a slot trench, and the drain trenches extend in the same direction and are parallel with one another.

3. The semiconductor device according to claim 1, wherein each of the drain trenches comprises a slot trench, and the drain trenches interlace with one another.

4. The semiconductor device according to claim 1, wherein the drain trenches are separated from one another, and at least some of the drain trenches are arranged by a hexagon configuration.

5. The semiconductor device according to claim 1, further comprising:
a contact structure disposed at the first side of the substrate, wherein the contact structure is electrically connected with the back contact structure.

6. The semiconductor device according to claim 1, wherein the first portion of the first III-V compound layer comprises an n-type lightly doped gallium nitride layer, and the second III-V compound layer comprises an n-type heavily doped gallium nitride layer.

7. The semiconductor device according to claim 1, wherein the third III-V compound layer comprises a p-type doped gallium nitride layer.

8. The semiconductor device according to claim 1, further comprising:
a nitride layer disposed at the first side of the substrate, wherein at least a part of the nitride layer is located directly between the gate electrode and the first III-V compound layer in a thickness direction of the substrate.

9. The semiconductor device according to claim 1, further comprising:
an insulation layer, at least a part of the insulation layer being disposed in the drain trenches, wherein each of the drain trenches is filled with the insulation layer and the drain electrode.

10. The semiconductor device according to claim 1, wherein each of the drain trenches is filled with the drain electrode.

11. The semiconductor device according to claim 1, wherein the gate electrode and the source electrode are disposed within a transistor unit area, and at least two of the drain trenches are disposed within the transistor unit area.

* * * * *